United States Patent
Liu et al.

(10) Patent No.: US 9,373,814 B2
(45) Date of Patent: Jun. 21, 2016

(54) ORGANIC LIGHT-EMITTING DIODE (OLED) DISPLAY PANEL, PIXEL DEFINE LAYER (PDL) AND PREPARATION METHOD THEREOF

(71) Applicant: BOE TECHNOLOGY GROUP CO., LTD., Beijing (CN)

(72) Inventors: Wei Liu, Beijing (CN); Chunsheng Jiang, Beijing (CN); Dongfang Wang, Beijing (CN); Yanzhao Li, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/360,190

(22) PCT Filed: Dec. 16, 2013

(86) PCT No.: PCT/CN2013/089502
§ 371 (c)(1),
(2) Date: May 22, 2014

(87) PCT Pub. No.: WO2015/010424
PCT Pub. Date: Jan. 29, 2015

(65) Prior Publication Data
US 2015/0194629 A1    Jul. 9, 2015

(30) Foreign Application Priority Data
Jul. 22, 2013  (CN) .......................... 2013 1 0308573

(51) Int. Cl.
*H01L 33/00*  (2010.01)
*H01L 51/52*  (2006.01)
(Continued)

(52) U.S. Cl.
CPC .......... *H01L 51/5253* (2013.01); *H01L 21/84* (2013.01); *H01L 27/326* (2013.01);
(Continued)

(58) Field of Classification Search
CPC ............ H01L 27/3246; H01L 27/3274; H01L 27/3283; H01L 29/42384; H01L 29/4908
See application file for complete search history.

(56) References Cited

U.S. PATENT DOCUMENTS 7,294,856 B2    11/2007  Ito et al.
8,048,599 B2 *  11/2011  Lo .......................... G02B 5/201
                                                    347/106
(Continued)

FOREIGN PATENT DOCUMENTS

CN    101399283 A    4/2009
CN    101926006 A    12/2010
(Continued)

OTHER PUBLICATIONS

Chinese Office Action of Chinese Application No. 201310308573.6, mailed May 11, 2015 with English translation.
(Continued)

*Primary Examiner* — Jaehwan Oh
(74) *Attorney, Agent, or Firm* — Collard & Roe, P.C.

(57) ABSTRACT

A pixel define layer (PDL) of an organic light-emitting diode (OLED) display panel, which comprises a first PDL (21) and a second PDL (22) overlapped on the first PDL. The first PDL (21) is a hydrophobic film layer provided with openings (210) corresponding to luminous regions of sub-pixel units; and the second PDL (22) is a hydrophilic film layer provided with openings (220) corresponding to the openings (210) of the first PDL. The PDL can avoid the mutual pollution of organic light-emitting materials in luminous regions of different colors in adjacent sub-pixel units in the preparation process.

18 Claims, 4 Drawing Sheets

(51) Int. Cl.
  *H01L 51/56*    (2006.01)
  *H01L 27/32*    (2006.01)
  *H01L 21/84*    (2006.01)
  *H01L 51/50*    (2006.01)
  *H01L 51/00*    (2006.01)

(52) U.S. Cl.
  CPC ........ *H01L 27/3206* (2013.01); *H01L 27/3246* (2013.01); *H01L 27/3258* (2013.01); *H01L 51/0012* (2013.01); *H01L 51/5036* (2013.01); *H01L 51/5056* (2013.01); *H01L 51/5072* (2013.01); *H01L 51/5096* (2013.01); *H01L 51/5206* (2013.01); *H01L 51/5221* (2013.01); *H01L 51/56* (2013.01); *H01L 2227/323* (2013.01); *H01L 2251/301* (2013.01); *H01L 2251/303* (2013.01)

(56) References Cited

U.S. PATENT DOCUMENTS

| | | | | |
|---|---|---|---|---|
| 8,207,529 | B2* | 6/2012 | Ahn | B82Y 10/00 257/40 |
| 9,087,763 | B2* | 7/2015 | Jiang | H01L 51/56 |
| 9,111,885 | B2 | 8/2015 | Burroughes et al. | |
| 2005/0112341 | A1* | 5/2005 | Ito | H01L 27/3246 428/209 |
| 2010/0177374 | A1* | 7/2010 | Nam | G02F 1/167 359/296 |
| 2010/0193791 | A1* | 8/2010 | Chun | H01L 27/3246 257/59 |
| 2010/0308317 | A1 | 12/2010 | Ahn et al. | |
| 2011/0127502 | A1* | 6/2011 | Kim | H01L 27/3283 257/40 |
| 2011/0198598 | A1* | 8/2011 | Kim | H01L 27/3246 257/59 |
| 2013/0330868 | A1* | 12/2013 | Suh | H01L 27/3246 438/34 |
| 2014/0131310 | A1 | 5/2014 | Jiang | |
| 2014/0319555 | A1* | 10/2014 | Prushinskiy | H01L 29/42384 257/91 |

FOREIGN PATENT DOCUMENTS

| | | |
|---|---|---|
| CN | 102945855 A | 2/2013 |
| CN | 102969333 A | 3/2013 |
| CN | 103413819 A | 11/2013 |

OTHER PUBLICATIONS

Second Chinese Office Action of Chinese Application No. 201310308573.6, mailed Oct. 12, 2015 with English translation.
English translation of the International Preliminary Report on Patentability and Written Opinion of the International Searching Authority of PCT/CN2013/089502, issued Jan. 26, 2016.
Third Chinese Office Action in Chinese Application No. 201310308573.6, mailed Mar. 1, 2016 with English translation.

\* cited by examiner

| sequentially forming a hydrophobic film layer and a hydrophilic film layer on a substrate respectively for covering the whole substrate by a coating processes | S11 |

| forming openings of the hydrophilic film layer and openings of the hydrophobic film layer, which are distributed according to an opening pattern, by patterning the hydrophilic film layer and the hydrophobic film layer in sequence | S12 |

ORGANIC LIGHT-EMITTING DIODE (OLED) DISPLAY PANEL, PIXEL DEFINE LAYER (PDL) AND PREPARATION METHOD THEREOF

CROSS REFERENCE TO RELATED APPLICATIONS

This application is the National Stage of PCT/CN2013/089502 filed on Dec. 16, 2013, which claims priority under 35 U.S.C. §119 of Chinese Application No. 201310308573.6 filed on Jul. 22, 2013, the disclosure of which is incorporated by reference.

TECHNICAL FIELD

Embodiments of the present invention relate to an organic light-emitting diode (OLED) display panel, a pixel define layer (PDL) and a preparation method thereof.

BACKGROUND

OLED display panel has gradually become one of the development trends in the flat-panel display field due to the advantages of low thickness, light weight, autoluminescence, wide viewing angle, high resolution, high brightness, rapid response, low energy consumption and the like.

A light-emitting device is disposed at a luminous region of each pixel unit in a pixel array of the OLED display panel, and each pixel unit is also provided with a thin-film transistor (TFT) disposed at a non-luminous region and configured to control the emission of the light-emitting device.

The light-emitting device takes an OLED device as an example. The method for manufacturing a TFT and an OLED in a pixel unit mainly comprises the following steps: preparing functional film layers of the TFT, e.g., a gate electrode, a gate insulating layer, an active layer and source/drain electrodes on a substrate in sequence at first; subsequently manufacturing a pixel electrode connected with the drain electrode; and finally preparing functional film layers of the OLED connected with the pixel electrode. Before the OLED is manufactured, a pixel defining layer (PDL) is prepared on the pixel electrode and configured to cover the TFT in the pixel unit and expose the region, used for manufacturing the OLED, in the pixel unit, so as to prevent film layer structures in the TFTs from being damaged by materials of the functional film layers in the OLED. The PDL is also configured to separate luminous regions (regions in which OLEDs are disposed) of different pixel units from each other.

Generally, the light-emitting device of each pixel unit may comprise a red light-emitting device for emitting red light, a green light-emitting device for emitting green light and a blue light-emitting device for emitting blue light. The OLED is disposed in the luminous region, defined by the PDL, in each pixel unit. Currently, the PDL generally adopts a single layer structure and is generally made of photoresist. A light-emitting layer of the OLED is generally made of a liquid organic light-emitting material by an inkjet printing technology. When the light-emitting layer of the OLED for emitting light of a certain color is prepared on the substrate, a liquid material ejected by the inkjet printing technology is prone to splash around. If the organic light-emitting material is splashed to luminous regions in which OLEDs of other colors have been disposed or splashed to luminous regions in which OLEDs of other colors to be formed are disposed, the light-emitting layers at the luminous regions will incur the problem of color blending, and hence the display effect can be seriously affected.

Moreover, as the PDL made of photoresist material is a hydrophobic organic material and the organic light-emitting material of the OLED is also a hydrophobic material, the contact area of the light-emitting layers formed by the inkjet printing technology with the PDL is large, and the light-emitting layer formed by the liquid organic light-emitting material in the luminous regions of the pixels are not smooth enough or may produce arched protrusions. Therefore, when a cathode is manufactured on the light-emitting layer, point contact can be easily incurred, and hence the problem of breakdown can be caused, and consequently the display effect can be seriously affected.

SUMMARY

Embodiments of the present invention provide an OLED display panel, a PDL and a preparation method thereof, which are used for avoiding the mutual pollution of organic light-emitting materials in luminous regions of different colors in adjacent sub-pixel units.

One embodiment of the present invention provides a PDL in an OLED display panel, which comprises a first PDL and a second PDL overlapped on the first PDL; the first PDL is a hydrophobic film layer provided with an opening corresponding to a luminous region of a sub-pixel unit; and the second PDL is a hydrophilic film layer provided with an opening corresponding to the opening of the first PDL.

In the PDL, the hydrophilic film layer is disposed on the hydrophobic film layer. When an organic light-emitting material is ejected to the hydrophilic film layer disposed on a surface layer, the organic light-emitting material will automatically slide back into filling areas of the organic light-emitting material as the organic light-emitting material is a hydrophobic material and has repulsive interaction with the hydrophilic film layer. Therefore, the mutual pollution of the organic light-emitting materials in luminous regions of different colors in adjacent sub-pixel units can be avoided.

For instance, the opening of the second PDL is less than the corresponding opening of the first PDL in size, so that a filling area of an organic light-emitting material to be filled, having a narrow upper portion and a wide lower portion, can be formed by the two corresponding openings of the first PDL and the second PDL.

As the filling area having the narrow upper portion and the wide lower portion is formed by the two corresponding openings of the first PDL and the second PDL, the liquid organic light-emitting material can be blocked by a recess structure having a narrow upper portion and a wide lower portion when entering the filling area, and hence the splashing of liquid drops can be avoided.

For instance, the filling area of the organic light-emitting material to be filled, having the narrow upper portion and the wide lower portion, is in a shape of a recess, and any side wall of the recess is in a shape of a trapezoid with a smooth surface. As any side wall of the recess has the smooth surface, a light-emitting layer with correspondingly smooth edge structure is formed by the organic light-emitting material in accordance with the smooth side wall.

For instance, the hydrophobic film layer may be a photoresist film layer. The photoresist film layer is a transparent film layer and may not affect the aperture opening ratio of image display.

For instance, the hydrophilic film layer may be a silicon oxide, silicon nitride or silicon oxynitride film layer. The silicon oxide, silicon nitride or silicon oxynitride film layer is a transparent film layer and may not affect the aperture opening ratio of image display. In addition, the film layer formed by silicon oxide, silicon nitride or silicon oxynitride has high density, and hence the color blending between organic light-emitting materials disposed in luminous regions of sub-pixels and organic light-emitting materials of other colors via the high-density film layer can be avoided.

For instance, the thickness of the first PDL is 3 to 5 times more than the thickness of the second PDL in size, namely the second PDL has a lower thickness. Therefore, the thickness of the whole PDL is almost determined by the first PDL, and the PDL with an appropriate thickness may be prepared according to actual requirements.

Another embodiment of the present invention provides an OLED display panel, which comprises a substrate, a plurality of sub-pixel units and a PDL. The plurality of sub-pixel units are arranged in matrixes and disposed on the substrate; each sub-pixel unit is provided with a thin film transistor (TFT); and the PDL is disposed on the substrate and configured to cover the TFTs, and is realized by the foregoing PDL. The probability of the color blending of organic light-emitting materials of the sub-pixel units of the OLED display panel is lower, and the product yield is higher.

Still another embodiment of the present invention provides a method for preparing a PDL in an OLED display panel, which comprises: forming a hydrophobic film layer and a hydrophilic film layer for covering a whole substrate respectively and sequentially; and forming openings of the hydrophilic film layer and openings of the hydrophobic film layer, which are distributed according to an opening pattern, by patterning the hydrophilic film layer and the hydrophobic film layer according to the predetermined opening pattern of the PDL. The hydrophobic film layer provided with the plurality of openings is a first PDL; and the hydrophilic film layer provided with the plurality of openings is a second PDL.

For instance, the PDL formed by the method may only comprise two layers. The structure of the PDL is simple and the preparation process flow is simple.

For instance, the process of forming the hydrophobic film layer for covering the whole substrate by a coating process may be as follows: coating a first photoresist film layer with default thickness for covering the whole substrate on the substrate by the coating process; solidifying the first photoresist film layer at the temperature of 150 to 250 centigrade in such a way that the shape of the first photoresist film layer cannot be changed; and preparing the PDL with a uniform thickness.

For instance, the process of forming the hydrophilic film layer for covering the whole substrate by the coating process may be as follows: depositing a silicon nitride, silicon oxide or silicon oxynitride film layer for covering the whole substrate on the solidified first photoresist film layer by chemical vapor deposition (CVD). The silicon nitride, silicon oxide or a silicon oxynitride film layer formed by CVD has higher density, so that the color blending between organic light-emitting materials disposed in luminous regions of sub-pixels and organic light-emitting materials of other colors via the film layer with high density can be avoided.

For instance, the first photoresist film layer is a positive photoresist film layer. The process of forming the openings of the hydrophilic film layer and the openings of the hydrophobic film layers, which are distributed according to the opening pattern, may be as follows: forming a positive photoresist film layer for covering the whole substrate on the silicon nitride, silicon oxide or silicon oxynitride film layer after the silicon nitride, silicon oxide or silicon oxynitride film layer is formed; and meanwhile exposing the second photoresist film layer and the first photoresist film layer corresponding to the opening pattern for 5,000 to 7,000 milliseconds according to the default opening pattern of the PDL, in which any side wall of an exposure area of the second photoresist film layer and the first photoresist film layer is in the shape of a trapezoid with a narrow upper portion and a wide lower portion.

For instance, after exposure, firstly, developing the second photoresist film layer, removing a portion of the second photoresist corresponding to the opening pattern, obtaining openings of the second photoresist film layer, and exposing the silicon nitride, silicon oxide or silicon oxynitride film layer disposed beneath the second photoresist film layer; secondly, etching the exposed silicon nitride, silicon oxide or silicon oxynitride film layer by a dry etching process, forming openings corresponding to the openings of the second photoresist film layer, and exposing the first photoresist film layer disposed beneath the silicon nitride, silicon oxide or silicon oxynitride film layer; thirdly, developing the exposed first photoresist film layer, removing first photoresist in exposure areas, and forming the openings of the first photoresist film layer; and finally, stripping remaining second photoresist on the silicon nitride, silicon oxide or silicon oxynitride film layer.

The method for preparing the openings of the hydrophilic film layer and the openings of the hydrophobic film layer simplifies the preparation process with the exposure of two photosensitive layers being conducted by one exposure process, and can form diffusion flux effect by a large-flux exposure process, so that the exposure area is in the shape which is narrow on the upper level and wide on the lower level and the openings with narrow upper portions and wide lower portions can be easily formed, and hence the splashing of organic light-emitting material in liquid-drops can be avoided.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

The embodiments of the present invention provides an OLED display panel, a PDL and a preparation method thereof, which are used to avoid the mutual pollution of organic light-emitting materials in luminous regions of different colors in adjacent sub-pixel units.

The PDL is configured to define the sub-pixel units, expose the luminous regions of the sub-pixel units, and cover remaining areas. The PDL provided by an embodiment of the present invention comprises two overlapped film layers. One layer disposed on the lower level (close to a substrate) is a hydrophobic film layer, and one layer disposed on the upper level is a hydrophilic film layer. When a liquid organic light-emitting material is ejected into luminous regions of sub-pixel units of a certain color by means of inkjet printing, the organic light-emitting material in liquid-drops can appear on the PDL around the luminous regions. But as the hydrophobic organic light-emitting material in liquid-drops is disposed on the hydrophilic film layer, the organic light-emitting material in liquid-drops will flow into the luminous regions of the sub-pixel units and will not flow into luminous regions of adjacent sub-pixel units of other colors due to the repulsive reaction between the hydrophobic organic light-emitting material in liquid-drops and the hydrophilic film layer. Therefore, the color blending of organic light-emitting materials of adjacent sub-pixel units of different colors can be avoided, namely the pollution of the organic light-emitting materials can be avoided.

Detailed description will be given below to the OLED display panel, the PDL and the preparation method thereof provided by the embodiment of the present invention with reference to the accompanying drawings.

Examples of the OLED display panel will be illustrated at first.

Figure 1:
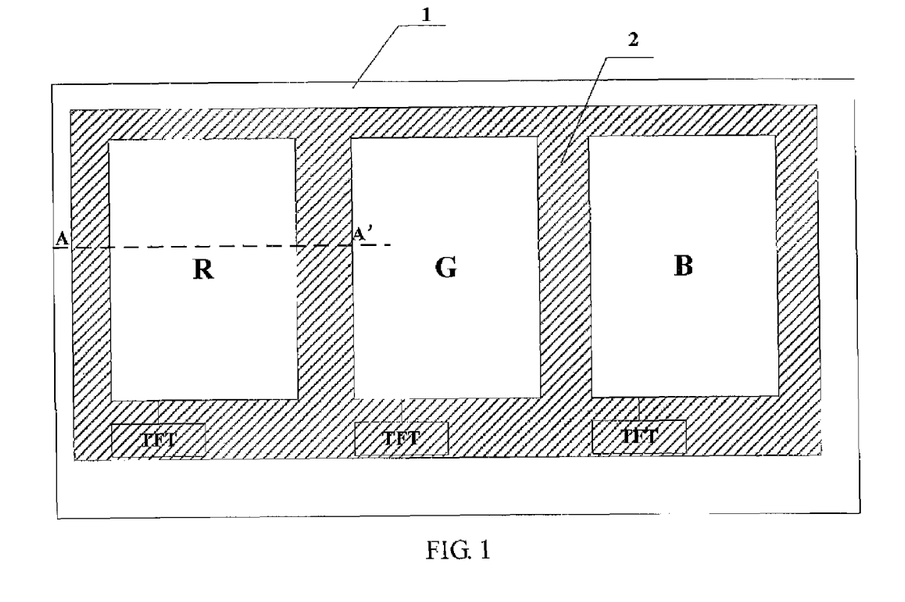
FIG. 1 is a schematic top view of an OLED display panel provided by an embodiment of the present invention.

FIG. 1 is a schematic top view of an OLED display panel. The OLED display panel comprises: red (R) sub-pixels, green (G) sub-pixel units and blue (B) sub-pixel units on a substrate 1, in which each sub-pixel unit is provided with at least one TFT; and a PDL 2 is disposed on the substrate 1 and configured to cover the TFTs and expose luminous regions of R, G and B colors. The TFTs are taken as switch elements. In addition, the substrate 1 may be also provided with gate lines, data lines, power lines (not shown) and the like as required. Organic light-emitting devices, e.g., OLEDs, are disposed in the luminous regions and configured to emit light of corresponding colors. An OLED generally includes at least three layers: a cathode layer, a light-emitting layer disposed on the cathode layer, and an anode layer disposed on the light-emitting layer. The area of the cathode layer, the light-emitting layer and the anode layer may correspond to the luminous regions respectively. Moreover, the OLED may further comprise functional layers such as an electron transport layer (ETL), a hole transport layer (HTL), an electron barrier layer (EBL) and a hole barrier layer (HBL) as required. The functional layers may be made of known materials or materials to be developed in the field. The specific structure and the material of the OLED are not limited in the present invention.

The light-emitting layers of the luminous regions of R, G and B colors are configured to inject liquid organic light-emitting materials capable of emitting light of R, G and B colors after application of voltages into the luminous regions defined by the PDL by means of inkjet printing.

When organic light-emitting materials of certain color are injected into a plurality of luminous regions, in order to avoid the pollution of the organic light-emitting materials due to the phenomena that the liquid organic light-emitting materials flow into adjacent luminous regions of different colors, the embodiments of the present invention provide a PDL for preventing the liquid organic light-emitting materials from flowing into the adjacent luminous regions of different colors.

Figure 2:
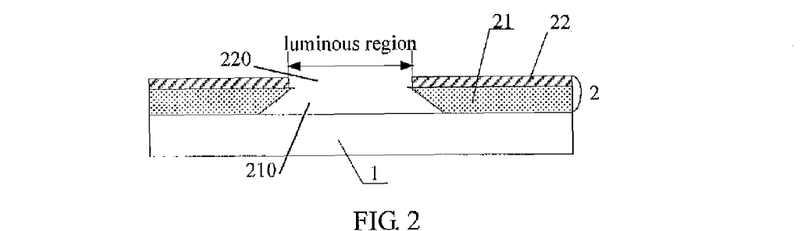
FIG. 2 is a sectional view of the OLED display panel as shown in FIG. 1 along A-A' direction.

FIG. 2 is a sectional view of the OLED display panel as shown in FIG. 1 in the A-A' direction. For convenience, only the substrate 1 and the PDL 2 disposed on the substrate are shown in the figure, and drive circuit structures such as the TFTs, the gate lines and the data lines are not shown in the figure. The PDL 2 includes a first PDL 21 disposed on the substrate 1 and a second PDL 22 overlapped on the first PDL 21; the first PDL 21 is provided with a plurality of openings 210 corresponding to the luminous regions of the sub-pixel units and is a hydrophobic film layer; the second PDL 22 is provided with a plurality of openings 220 in one-to-one correspondence with the openings 210 in the first PDL 21 and is a hydrophilic film layer.

As seen from FIG. 2, the luminous regions defined by the PDL are filling areas of organic light-emitting materials to be filled before the light-emitting materials are injected, and the filling areas are similar to recesses in shape. When a liquid organic light-emitting material is required to be injected into luminous regions of a certain color defined by the PDL, the organic light-emitting material in liquid-drops tends to fall onto a PDL on the periphery of the luminous regions. More specifically, the organic light-emitting material in liquid-drops falls onto the second PDL far away from the substrate. As the organic light-emitting material is a hydrophobic material and has poor bonding force with the second PDL made of a hydrophilic material, the organic light-emitting material in liquid-drops disposed on the PDL on the periphery of the luminous regions tends to automatically slide back into the luminous regions (namely the filling areas) of corresponding colors, and hence the color blending of liquid drops with luminous regions of other colors can be avoided.

In addition, as the first PDL close to the substrate is a hydrophobic film layer in the embodiments of the present invention, which has good bonding force with the hydrophobic organic light-emitting material, the hydrophobic organic light-emitting material can be flattened by the hydrophobic first PDL, so that the light-emitting layer formed by the injection of the organic light-emitting material into the luminous regions by means of inkjet printing is a film layer which covers the whole luminous region and has a smooth surface. Therefore, no arched protrusions are formed on the light-emitting layer, and hence the easy breakdown of the organic light-emitting device due to the point contact between the light-emitting layer and a cathode layer formed on the light-emitting layer subsequently can be avoided.

Moreover, in order to avoid color blending of splashed liquid drops to the luminous regions of other colors due to the liquid-drop splashing of the liquid organic light-emitting materials injected into the luminous regions, as illustrated in FIG. 2, the opening 220 of the second PDL 22 provided by the embodiments of the present invention is less than the corresponding opening 210 of the first PDL 21 in size, so that a filling area of the organic light-emitting material to be filled having a narrow upper portion and a wide lower portion can be formed by the two corresponding openings of the first PDL 21 and the second PDL 22.

As the filling area having the narrow upper portion and the wide lower portion is formed by the two corresponding openings 210 and 220 of the first PDL 21 and the second PDL 22, the liquid organic light-emitting material is blocked by the recess structure having a narrow upper portion and a wide lower portion when entering the filling area, and hence the problem of liquid-drop splashing can be avoided.

For instance, the thickness of the first PDL 21 may be 3 to 5 times more than the thickness of the second PDL 22, namely the second PDL 22 has a smaller thickness. Therefore, the thickness of the whole PDL 2 is almost determined by the first PDL 21, and the PDL 2 with an appropriate thickness may be prepared according to actual requirements.

As the thickness of the first PDL 21 is almost 3 to 5 times more than the thickness of the second PDL 22, e.g., the thickness of the first PDL 21 is 1.2 μm and the thickness of the second PDL 22 is 0.3 μm, a side wall of the recess area having a narrow upper portion and a wide lower portion is mainly the side wall formed by the second PDL 22.

For the light-emitting layer filled in the luminous regions becomes a light-emitting layer having an edge structure which is regular and has no burrs, for instance, any side wall of the recess area having the narrow upper portion and the wide lower portion is in the shape of a trapezoid with a smooth surface. As any side wall of the recess area has the smooth surface, the light-emitting layer with correspondingly smooth edge structure is formed by the organic light-emitting materials in light of the smooth side wall.

A longitudinal section of the filling area of the organic light-emitting material formed by the first PDL and the second PDL has an inverted trapezoidal structure. The structure can also effectively avoid the splashing of liquid drops.

For instance, the hydrophobic film layer may be an organic resin layer, and the hydrophilic film layer may be made of silicon oxide, silicon nitride or silicon oxynitride. The film layer made of the silicon oxide, silicon nitride or silicon oxynitride has a high density, so that the color blending between the organic light-emitting materials disposed in the luminous regions of the sub-pixels and organic light-emitting materials of other colors via the high-density film layer can be avoided.

For instance, the hydrophobic film layer is a transparent photoresist film layer with photosensitivity, and the hydrophilic film layer is a transparent silicon oxide, silicon nitride or silicon oxynitride film layer.

It should be noted that the OLED display panel provided by the embodiments of the present is only illustrated by taking R, G and B colors as an example, but the embodiment of the present invention is not limited to the combination of R, G and B colors and may also adopt the combination of other colors, e.g., may adopt the combination of R, G, B and W (white) colors and the like.

Detailed description will be given below to the process flow of the method for preparing the PDL provided by an embodiment of the present invention.

Figure 3:
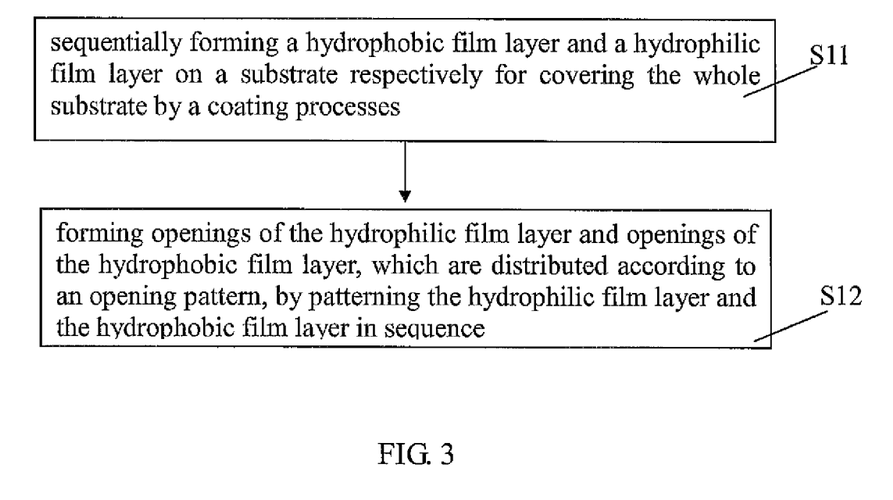
FIG. 3 is a flowchart of a method for preparing a PDL in an OLED display panel provided by an embodiment of the present invention.

As illustrated in FIG. 3, the method provided by the embodiment of the present invention comprises the following steps:

S11: sequentially forming a hydrophobic film layer and a hydrophilic film layer on a substrate respectively for covering the whole substrate by a coating processes (film-forming processes) for instance; and S12: forming openings of the hydrophilic film layer and openings of the hydrophobic film layer, which are distributed according to an opening pattern, by patterning the hydrophilic film layer and the hydrophobic film layer in sequence according to the default opening pattern of a PDL.

Herein, the hydrophobic film layer provided with the plurality of openings is a first PDL, and the hydrophilic film layer provided with the plurality of openings is a second PDL.

In the embodiment of the present invention, the patterning process at least includes exposure, development, etching (wet etching or dry etching) and the like.

Figure 4:
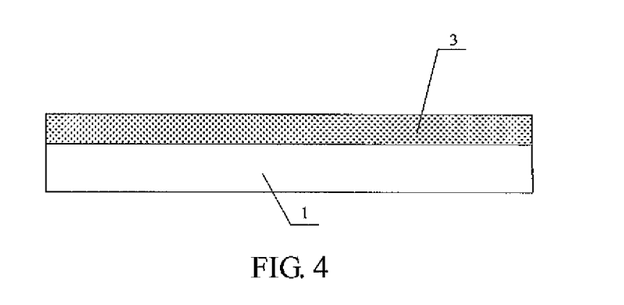
FIG. 4 is a schematic structural view of a PDL provided with a hydrophobic film layer provided by an embodiment of the present invention.

One example of the method provided by an embodiment of the present invention comprises the following steps:

Step 1: as illustrated in FIG. 4, forming a hydrophobic film layer 3 disposed on a substrate 1.

For instance, the hydrophobic film layer 3 is a first photoresist film layer, which covers the whole substrate and has a thickness of approximately 1.2 μm, coated on the substrate by a coating process, and first photoresist is high-temperature resistant positive photoresist. For instance, the first photoresist film layer is solidified for about 1 hour at the temperature of 150 to 250 centigrade. Preferably, the first photoresist film layer is solidified at the temperature of 230 centigrade. The objective of solidification is for the convenience of preparing other film layers on the first photoresist film layer subsequently.

Herein, in the step 1, the first photoresist film layer is not subjected to patterning processing but is subjected to patterning processing together with a hydrophilic film layer later to be formed thereon, so that the process can be saved.

Figure 5:
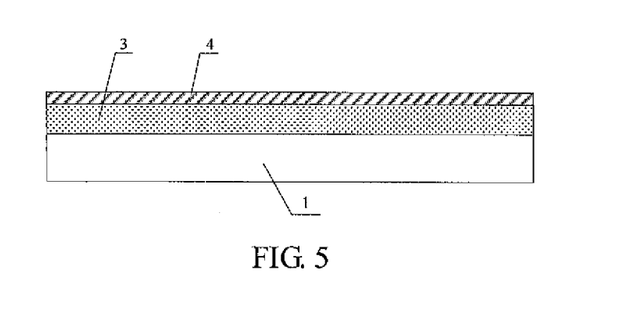
FIG. 5 is a schematic structural view of a PDL obtained by preparing a hydrophilic film layer as shown in FIG. 4.

Step 2: as illustrated in FIG. 5, forming a hydrophilic film layer 4 disposed on the hydrophobic film layer 3.

For instance, a silicon dioxide (SiO2) film layer which has a thickness of approximately 0.3 μm and covers the whole substrate is deposited on the solidified first photoresist film layer by CVD. The SiO2 film layer is a transparent hydrophilic film layer and has repulsive reaction against the organic light-emitting material disposed thereon.

Of course, the hydrophilic film layer may also be made of silicon nitride, silicon oxynitride and the like. The silicon nitride, silicon oxide or silicon nitride oxide film layer formed by CVD has a higher density, so that the color blending between the organic light-emitting material disposed in a luminous region of a sub-pixel and the organic light-emitting materials of other colors via the high-density film layer can be avoided.

Figure 6:
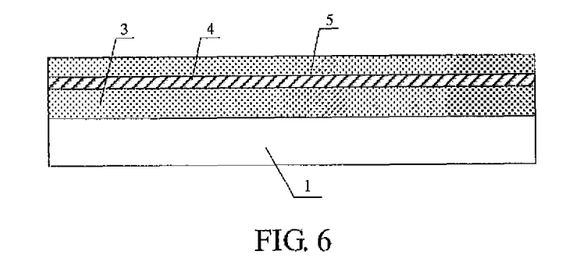
FIG. 6 is a schematic structural view of a PDL obtained by preparing second photoresist as shown in FIG. 5.

Step 3: as illustrated in FIG. 6, forming a second photoresist film layer 5 disposed on the hydrophilic film layer 4. The second photoresist film layer 5 is also made of positive photoresist.

For instance, the second photoresist film layer which is disposed on the SiO2 film layer and covers the whole substrate is formed by a coating process.

Figure 7:
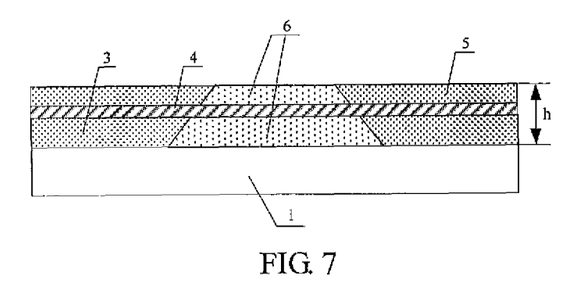
FIG. 7 is a schematic structural view of a PDL obtained after exposure as shown in FIG. 6.

Step 4: exposing the second photoresist film layer and the first photoresist film layer simultaneously according to a default opening pattern of a PDL, and forming exposure areas 6 as shown in FIG. 7.

For instance, the second photoresist film layer and the first photoresist film layer corresponding to the opening pattern are subjected to exposure simultaneously by an exposure device according to the default opening pattern of the PDL.

For instance, the second photoresist film layer and the first photoresist film layer corresponding to the opening pattern are subjected to a large-flux exposing process simultaneously for 5,000 to 7,000 milliseconds. For instance, the second photoresist film layer and the first photoresist film layer may be subjected to a large-flux exposing process for 6,000 milliseconds. Herein, the diffusion flux effect of large-flux exposure can be achieved through the adjustment of the exposure time under certain conditions (e.g., general exposure dose). In addition, the diffusion flux effect may also be achieved by the simultaneous adjustment of the exposure dose and the exposure time according to different conditions. For instance, as for general photoresist, the exposure dose acted on the photoresist is 25-32 mJ/cm2.

As the SiO2 film layer is a transparent film layer, the second photoresist film layer and the first photoresist film layer can be subjected to large-flux exposure simultaneously.

It should be noted that: as illustrated in FIG. 7, the diffusion flux effect can be achieved by large-flux exposure, and the exposure areas 6 on the second photoresist film layer 5 and the first photoresist film layer 3 are as follows: the coverage area of exposure on the second photoresist film layer 5 corresponds to an opening area, but the coverage area of exposure on the first photoresist film layer 3 is slightly greater than the opening area; and the exposure depth h is from the top of the hydrophilic film layer to the bottom of the hydrophobic film layer.

Figure 8:
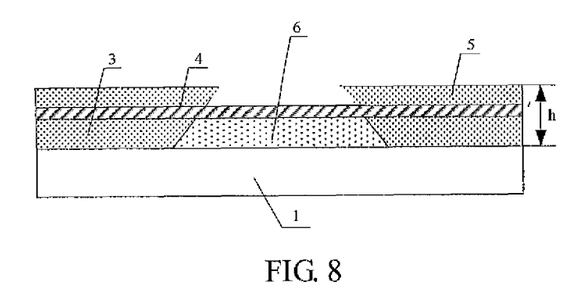
FIG. 8 is a schematic structural view of a PDL obtained after first development as shown in FIG. 7.

Step 5: developing the photoresist, removing the photoresist exposure area, exposing the SiO2 film layer disposed beneath the photoresist, and forming a structure as shown in FIG. 8. At this point, only the exposure area 6 on the first photoresist film layer 3 is left over.

The objective of the step is to form a window for the convenience of etching the exposed SiO2 film layer through the window.

Figure 9:
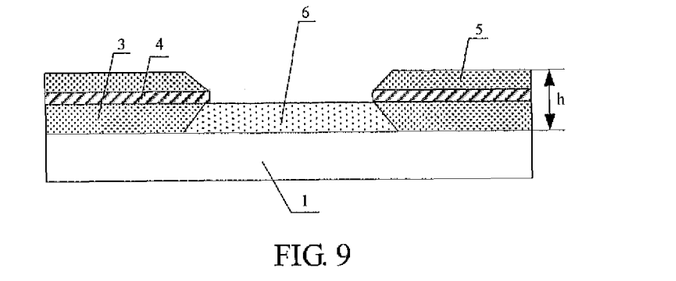
FIG. 9 is a schematic structural view of a PDL obtained after first etching of the PDL as shown in FIG. 8.

Step 6: etching the exposed SiO2 film layer 4 as shown in FIG. 8 in such a way that the first photoresist 3 at a corresponding area can be exposed, and forming a structure as shown in FIG. 9.

For instance, the exposed SiO2 film layer 4 is etched by a dry etching process to form openings corresponding to openings of the photoresist and expose the first photoresist film layer disposed beneath the exposed SiO2 film layer 4.

Figure 10:
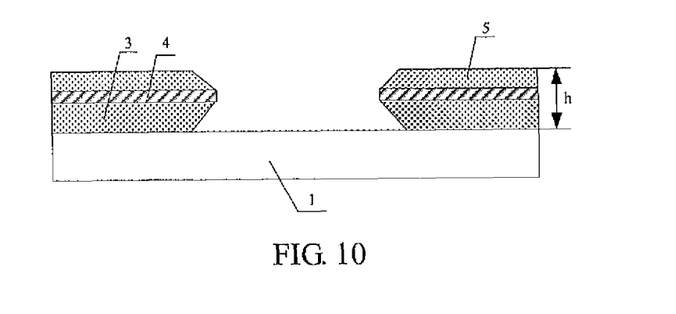
FIG. 10 is a schematic structural view of a PDL obtained after secondary development of the PDL as shown in FIG. 9.

Step 7: developing the first photoresist film layer, removing the exposure area in the first photoresist film layer, and forming a structure as shown in FIG. 10.

Step 8: stripping the remaining photoresist portion and forming a PDL structure as shown in FIG. 2.

Of course, the method for preparing the PDL provided by the embodiments of the present invention is not limited to the forming of the openings by one large-flux exposure process, and for instance, the PDL may also be formed by the process flow of exposure, development, etching and the like on the hydrophobic film layer and the hydrophilic film layer respectively and sequentially.

The method for preparing the PDL provided by the embodiment of the present invention, for instance, adopts one large-flux exposure process to obtain an opening having a narrow upper portion and a wide lower portion once, so that the process flow of the method for preparing the PDL can be simplified.

The embodiments of the present invention further provide a display device. The display device is a display device comprising the OLED display panel provided by the embodiment of the present invention, and for instance may be an OLED display panel, an OLED display, or an OLED TV.

In summary, the PDL provided by the embodiment of the present invention comprises two sub-layers: one layer disposed on a lower level is the hydrophobic film layer and one layer disposed on an upper level is the hydrophilic film layer.

As the organic light-emitting material to be formed in the openings of the hydrophobic film layer and the hydrophilic film layer is a hydrophobic material, has repulsive reaction against the hydrophilic film layer and has mutual attraction with the hydrophobic film layer, when the liquid organic light-emitting material is ejected into the luminous regions of corresponding pixel units by means of inkjet printing, the organic light-emitting material in liquid-drops unavoidably appears at the positions of the PDL close to the luminous regions. As the hydrophobic organic light-emitting material in liquid-drops is disposed on the hydrophilic film layer, the liquid drops will flow into the luminous regions and will not flow into adjacent luminous regions due to the microscopic repulsive reaction between the hydrophobic organic light-emitting material in liquid-drops and the hydrophilic film layer. Therefore, the pollution of the organic light-emitting material upon organic light-emitting materials in luminous regions of adjacent sub-pixel units can be avoided.

The foregoing is only the preferred embodiments of the present invention and not intended to limit the scope of protection of the present invention. The scope of protection of the present invention should be defined by the appended claims.

The invention claimed is:

1. A pixel define layer (PDL) in an organic light-emitting diode (OLED) display panel, comprising a first PDL and a second PDL overlapped on the first PDL, wherein
   the first PDL is a hydrophobic film layer provided with an opening corresponding to a luminous region of a sub-pixel unit; and
   the second PDL is a hydrophilic film layer provided with an opening corresponding to the opening of the first PDL, wherein the hydrophobic film layer is a photoresist film layer.

2. The PDL according to claim 1, wherein the opening of the second PDL are less than the corresponding opening of the first PDL in size, so that the two corresponding openings of the first PDL and the second PDL together forms a filling area of an organic light-emitting material to be filled, having a narrow upper portion and a wide lower portion.

3. The PDL according to claim 2, wherein the filling area of the organic light-emitting material to be filled, having the narrow upper portion and the wide lower portion, is in a shape of a recess, and any side wall of the recess is in a shape of a trapezoid with a smooth surface.

4. The PDL according to claim 1, wherein the hydrophilic film layer is a silicon oxide, silicon nitride or silicon oxynitride film layer.

5. The PDL according to claim 1, wherein a thickness of the first PDL is 3 to 5 times more than the thickness of the second PDL.

6. An Organic Light-Emitting Diode (OLED) display panel, comprising: a substrate; a plurality of sub-pixel units arranged in matrixes and disposed on the substrate, in which each sub-pixel unit is provided with a thin film transistor (TFT); and a pixel define layer (PDL) disposed on the substrate and configured to cover TFTs, in which the PDL is the PDL according to any one of claims 1 to 3 or 4 to 5.

7. The PDL according to claim 2, wherein the hydrophobic film layer is a photoresist film layer.

8. The PDL according to claim 2, wherein the hydrophilic film layer is a silicon oxide, silicon nitride or silicon oxynitride film layer.

9. The PDL according to claim 2, wherein a thickness of the first PDL is 3 to 5 times more than the thickness of the second PDL.

10. The PDL according to claim 3, wherein the hydrophobic film layer is a photoresist film layer.

11. The PDL according to claim 3, wherein the hydrophilic film layer is a silicon oxide, silicon nitride or silicon oxynitride film layer.

12. The PDL according to claim 3, wherein a thickness of the first PDL is 3 to 5 times more than the thickness of the second PDL.

13. The PDL according to claim 1, wherein the PDL consists of a first PDL and a second PDL.

14. A method for preparing the pixel define layer (PDL) in the Organic Light-Emitting Diode (OLED) display panel according to claim 1, comprising:
- forming a hydrophobic film layer and a hydrophilic film layer for covering a whole substrate respectively and sequentially; and
- forming openings of the hydrophilic film layer and openings of the hydrophobic film layer, which are distributed according to an opening pattern, by patterning the hydrophilic film layer and the hydrophobic film layer according to a predetermined opening pattern of the PDL.

15. The method according to claim 14, wherein the hydrophobic film layer is obtained by coating a first photoresist film layer, which covers the whole substrate and has a default thickness, on the substrate by a coating process, and solidifying the first photoresist film layer at a temperature of 150 to 250 centigrade.

16. The method according to claim 15, wherein the hydrophilic film layer is obtained by depositing a silicon nitride, silicon oxide or silicon oxynitride film layer for covering the whole substrate on the solidified first photoresist film layer by chemical vapor deposition (CVD).

17. The method according to claim 16, further comprising:
- forming a positive photoresist film layer for covering the whole substrate on the silicon nitride, silicon oxide or silicon oxynitride film layer after the silicon nitride, silicon oxide or silicon oxynitride film layer is formed; and
- simultaneously exposing the second photoresist film layer and the first photoresist film layer corresponding to the opening pattern for 5,000 to 7,000 milliseconds according to the default opening pattern of the PDL, in which any side wall of an exposure area of the second photoresist film layer and the first photoresist film layer is in a shape of a trapezoid with a narrow upper portion and a wide lower portion.

18. The method according to claim 17, further comprising:
- after exposure, firstly, developing the second photoresist film layer, removing a portion of the second photoresist corresponding to the opening pattern, obtaining openings of the second photoresist film layer, and exposing the silicon nitride, silicon oxide or silicon oxynitride film layer disposed beneath the second photoresist film layer;
- secondly, etching the exposed silicon nitride, silicon oxide or silicon oxynitride film layer by a dry etching process, forming openings corresponding to the openings of the second photoresist film layer, and exposing the first photoresist film layer disposed beneath the silicon nitride, silicon oxide or silicon oxynitride film layer;
- thirdly, developing the exposed first photoresist film layer, removing the first photoresist film layer in exposure areas, and forming the openings of the first photoresist film layer; and
- finally, stripping the remaining second photoresist film layer on the silicon nitride, silicon oxide or silicon oxynitride film layer.

* * * * *